Sept. 10, 1963 C. E. DAVID 3,103,636
AUTOMATIC GAIN CONTROL FOR TRANSISTOR AMPLIFER
Filed Jan. 4, 1961
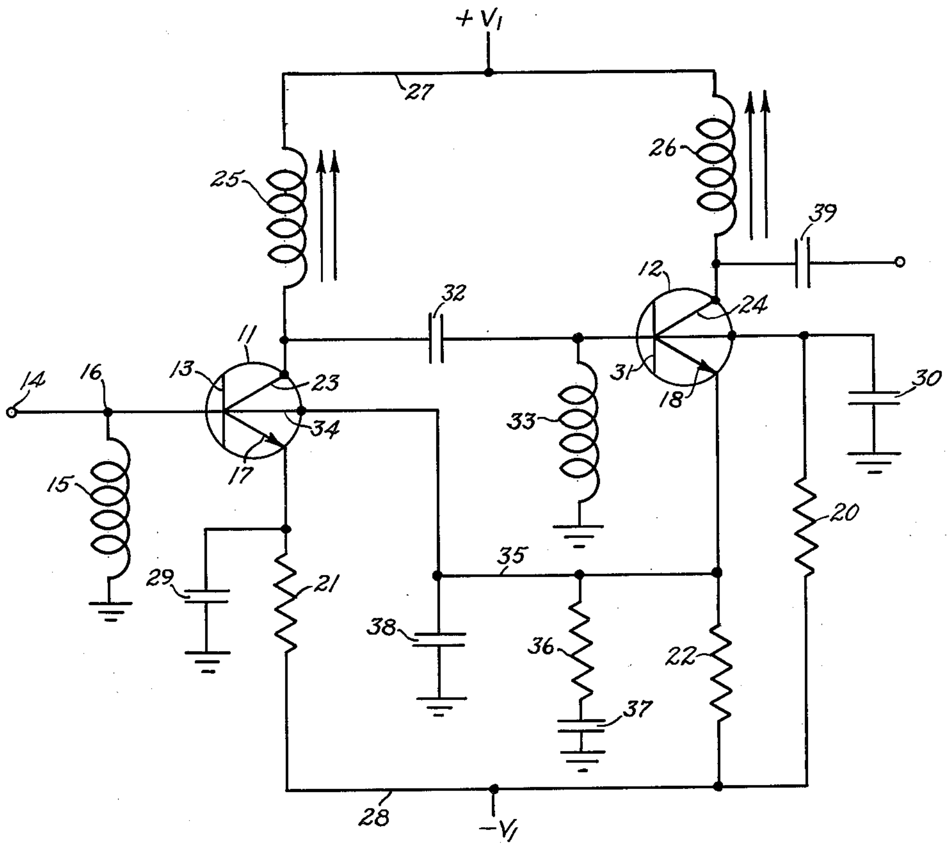
INVENTOR.
CHARLES E. DAVID
BY
H. H. Losche
Paul S. Collignon
ATTORNEYS

1

3,103,636
AUTOMATIC GAIN CONTROL FOR TRANSISTOR AMPLIFIER

Charles E. David, Indianapolis, Ind., assignor to the United States of America as represented by the Secretary of the Navy Filed Jan. 4, 1961, Ser. No. 80,709
3 Claims. (Cl. 330—29)
(Granted under Title 35, U.S. Code (1952), sec. 266)

The invention described herein may be manufactured and used by or for the Government of the United States of America for governmental purposes without the payment of any royalties thereon or therefor.

The present invention relates to a transistor amplifier and more particularly to a transistor signal amplifier having automatic gain control.

Heretofore, various devices have been employed for maintaining the amplitude of an intermediate frequency signal, which is applied to a second detector stage, constant over a wide range of variations in the amplitude of a received signal. In one type of device, a signal responsive voltage or current is applied to an emitter or base electrode of one or more transistor amplifiers to control their gain inversely with signal strength. This device, however, has a disadvantage in that the transistors input resistance varies as their gain is controlled.

In another known device, a detector is used that adds power to a detected signal and the detected signal is fed back to the emitter and base of one or more stages of the amplifier. The disadvantage of this type of device is that the circuit is too slow to be effective, particularly in the radar field where the time element is critical.

The present invention provides a transistor amplifier having automatic gain control which embraces all the advantages of similarly employed amplifiers and possesses none of the aforedescribed disadvantages. To attain this, the present invention contemplates at least a first and second stage of amplification, and each stage is comprised of a tetrode transistor. With the transistors properly biased, when large signals are applied to the tetrode transistor in the second stage, this transistor operates as a nonlinear device and as a result, there is a shift in the average value of the collector and emitter currents. The emitter is bypassed with a small capacitor that offers a low impedance to the IF frequency only and the change in the average value of emitter current can be detected across an emitter resistor. This results in a video type pulse that can be used for gain control.

Due to the nonlinear characteristics of the tetrode transistor, the collector current swings farther in the positive direction than in the negative direction and as a result there is a shift in the average collector current in a positive direction, and also there results a video type pulse at the emitter resistor which tends to drive the base to emitter voltage back toward zero. Thus there is a form of negative feedback on the second stage and the video type pulse is reflected to base-two of the first tetrode transistor and drives it back toward zero. Since base-two is used for gain control, the gain of the preceding stage has been automatically reduced.

It is a general object of the present invention to provide a transistor amplifier having automatic gain control.

Another object of the present invention is to provide automatic gain control for a transistor amplifier while using a minimum number of parts.

Other objects and advantages of the present invention will be readily appreciated as the same becomes better understood by reference to the following detailed description when considered in connection with the accompanying drawing which shows a preferred embodiment of the invention.

2

Referring now to the drawing, there is shown a two-stage signal amplifier circuit comprised of transistors 11 and 12. Transistors 11 and 12 are of the tetrode type and each have four electrodes, namely, an emitter, a collector, a normal base electrode, and an auxiliary base electrode. The normal base electrode 13 of transistor 11 is connected to input terminal 14, and choke 15 is connected between junction point 16 and ground to insure that base electrode 13 is at D.C. ground, and also choke 15 is provided to tune out the input capacitance of transistor 11. The emitter 17 of transistor 11 is connected to the emitter 18 of transistor 12 through resistors 21 and 22, and the collector 23 of transistor 11 is connected to the collector 24 of transistor 12 through variable inductors 25 and 26. Resistors 21 and 22 set the direct current bias on transistors 11 and 12, respectively. Resistor 20 also functions as a biasing resistor and capacitors 29 and 30, which have one terminal connected to ground, serve as bypass capacitors. In order to provide the proper bias for transistors 11 and 12, a positive supply voltage ($+V_1$) is connected to lead 27 and a negative supply voltage ($-V_1$) is connected to lead 28. The normal base electrode 31 of transistor 12 is connected to collector 23 of transistor 11 through capacitor 32. Variable inductor 25, capacitor 32, and choke 33, serve as an interstage coupling network.

Automatic gain control of the amplifier circuit shown in the drawing is accomplished by connecting the auxiliary base electrode 34 of transistor 11 directly to the emitter 18 of transistor 12 through lead 35. Resistor 36 and capacitor 37 are connected in series between lead 35 and ground, and likewise, capacitor 38 is connected between lead 35 and ground. Capacitor 38 offers a low impedance to the IF frequency and capacitor 37 functions as an emitter bypass capacitor. Resistor 36 is provided in order to reflect the average change in the emitter current of transistor 12.

By way of example, transistors 11 and 12 may be of type 3N35 silicon tetrode transistors, and the following table lists the values of the various components of a preferred embodiment of the present invention, it being understood that various changes in the listed values may be made without departing from the scope of the invention.

*Table I*

| Component: | | Value |
|---|---|---|
| 15 | μhenries | 0.15 |
| 20 | ohms | 180K |
| 21 | do | 16K |
| 22 | do | 16K |
| 29 | μfarads | 0.2 |
| 30 | μμfarads | 820 |
| 32 | do | 6 |
| 33 | μhenries | 0.15 |
| 36 | ohms | 510 |
| 37 | μfarads | 0.2 |
| 38 | μμfarads | 100 |

In operation, transistors 11 and 12 operate as nonlinear devices and, as a result, when large signals are applied, there is a shift in the average value of the collector and emitter currents. Due to the nonlinear characteristics of transistors 11 and 12, the collector current of transistor 12 swings further in the positive direction than in the negative, which results in a shift of the average value of the collector current in the positive direction. As the emitter 18 of transistor 12 is bypassed by capacitor 37, any change in the average value of the emitter current of transistor 12 is reflected across emitter resistor 36. This results in a video pulse at the emitter resistor 36 which tends to drive the emitter voltage back to zero, and thus is a form of negative feedback. As the emitter 18 of transistor 12 is connected by lead 35 to the auxiliary base electrode 34 of transistor 11, the video type pulse is reflected to base electrode 34 and drives its voltage back toward zero also. As base electrode 34 is used for gain control, the gain of the preceding stage has been automatically reduced.

It can thus be seen that the present invention provides an improved circuit for providing automatic gain control for a transistor amplifier without requiring the use of a detector.

Obviously many modifications and variations of the present invention are possible in the light of the above teachings. It is therefore to be understood, that within the scope of the appended claims, the invention may be practiced otherwise than as specifically described.

What is claimed is:

1. An automatic gain control system comprising:
   (*a*) first and second transistor signal amplifying devices each having an emitter, a collector electrode, a normal base electrode, and an auxiliary base electrode,
   (*b*) interstage coupling means connecting said first and second transistor signal amplifying devices,
   (*c*) means for biasing said first and second transistor amplifying devices for nonlinear operation, and
   (*d*) a feedback network directly coupled between said emitter on said second transistor signal amplifying device and said auxiliary base electrode on said first transistor amplifying device for applying a video type pulse to said auxiliary base electrode of said first transistor signal amplifying device whereby the gain of said transistor signal amplifying device is automatically controlled.

2. An automatic gain control as set forth in claim 1 wherein said feedback network includes an emitter bypass capacitor and an emitter resistor connected between one end of said bypass capacitor and the emitter of said second transistor signal amplifying device for reflecting any change in the average emitter current of said emitter to said auxiliary base electrode of said first transistor signal amplifying device.

3. An automatic gain control system as set forth in claim 1 wherein said interstage coupling means includes first and second variable inductors connected in series between the collector on said first transistor and the collector on said second transistor and a capacitor connected between said collector on said first transistor and the normal base electrode on said second transistor.

References Cited in the file of this patent

UNITED STATES PATENTS 2,859,286 Kennedy ______________ Nov. 4, 1958